United States Patent
Dragoi et al.

(10) Patent No.: US 6,781,360 B1
(45) Date of Patent: Aug. 24, 2004

(54) JUMP BAR SHUNT STRUCTURE FOR POWER COMPONENTS

(75) Inventors: Corneliu Dragoi, London (CA); Attila Simofi-Ilyes, London (CA); Stefan Smorowski, London (CA)

(73) Assignee: Siemens VDO Automotive Inc., Mississauga (CA)

( * ) Notice: Subject to any disclaimer, the term of this patent is extended or adjusted under 35 U.S.C. 154(b) by 31 days.

(21) Appl. No.: 10/361,746

(22) Filed: Feb. 10, 2003

(51) Int. Cl.[7] ................................................. G01R 1/14
(52) U.S. Cl. ...................................................... 324/126
(58) Field of Search ................................. 324/126–127, 324/117 R; 361/679, 748, 780–783, 803; 257/691–696

(56) References Cited

U.S. PATENT DOCUMENTS

| | | | | |
|---|---|---|---|---|
| 3,245,021 A | * | 4/1966 | Kernander et al. | 324/126 |
| 4,001,684 A | * | 1/1977 | Fritts | 324/126 |
| 4,140,961 A | * | 2/1979 | Akamatsu | 324/126 |
| 4,941,067 A | * | 7/1990 | Craft | 361/721 |
| 4,945,445 A | * | 7/1990 | Schmerda et al. | 324/126 |
| 5,225,769 A | * | 7/1993 | Fincke et al. | 324/127 |
| 6,359,331 B1 | * | 3/2002 | Rinehart et al. | 257/691 |
| 6,362,964 B1 | * | 3/2002 | Dubhashi et al. | 361/707 |
| 6,646,430 B1 | * | 11/2003 | Skerritt et al. | 324/126 |

FOREIGN PATENT DOCUMENTS

GB 0628826 A1 * 6/1994 ............ G01R/1/20

* cited by examiner

*Primary Examiner*—Kamand Cuneo
*Assistant Examiner*—Jermele Hollington

(57) ABSTRACT

A jump bar shunt structure 30 includes a base 32 constructed and arranged to be mounted to a substrate and to function as a current shunt; a pair of first legs 34 and 36 integral with the base and being constructed and arranged to be connected between terminals of at least two power devices such as MOSFETs; and a pair of second legs 50 and 52 integral with the base and being constructed and arranged to be connected to a printed circuit board so as to define a current sensing connection. The jump bar shunt structure is a single component that carries high current between two or more power devices and converts current into voltage that is used by the current measurement circuitry. The advantage of the jump bar shunt structure is that no high current (motor current) flows through a control PCB.

16 Claims, 3 Drawing Sheets

JUMP BAR SHUNT STRUCTURE FOR POWER COMPONENTS

FIELD OF THE INVENTION

The invention relates to electric circuits and more particularly, to circuits where a current shunt-measuring device is required in combination with power components.

BACKGROUND OF THE INVENTION

With reference to FIG. 1, a typical application of a current shunt is shown for an electronically speed controlled DC motor application. A jump bar 10 carries high current between two MOSFETs, 12 and 14. A current shunt 16 converts the current into voltage that is used by current measurement circuitry 18. A disadvantage of this approach is that the current measuring shunt 16 is mounted on a low power control printed circuit board (PCB) (not shown). Therefore, the high current through the shunt 16 (equal to the operating current of motor 20) produces heat that affects the operating temperature of the control circuitry. Also, additional PCB area is required for the high current traces.

Accordingly, there is a need to provide the function of a current measuring shunt and a high current connection bar so that no high current flows through the control PCB and no heat is added to the control PCB.

SUMMARY OF THE INVENTION an object of the invention is to fulfill the need referred to above. In accordance with the principles of the present invention, this objective is achieved by providing a jump bar shunt structure including a base constructed and arranged to be mounted to a substrate and to function as a current shunt, a pair of first legs integral with the base and being constructed and arranged to be connected between terminals of at least two power devices such as MOSFETs, and a pair of second legs integral with the base and being constructed and arranged to be connected to a printed circuit board so as to define a current sensing connection.

In accordance with another aspect of the invention a power device assembly includes a substrate, a switching MOSFET mounted to the substrate, the switching MOSFET having a source leg; a reverse voltage protection (RVP) MOSFET mounted to the substrate, the RVP MOSFET having a source leg; and a jump bar shunt structure. The jump bar shunt structure includes a base; a pair of first legs integral with the base, one leg of the pair of first legs being connected to the source leg of the switching MOSFET and the other leg of the first pair of legs being connected to the source leg of the RVP MOSFET; and a pair of second legs integral with the base and being constructed and arranged to be connected to a printed circuit board so as to define a current sensing connection.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF THE EXEMPLARY EMBODIMENT

Figure 1:
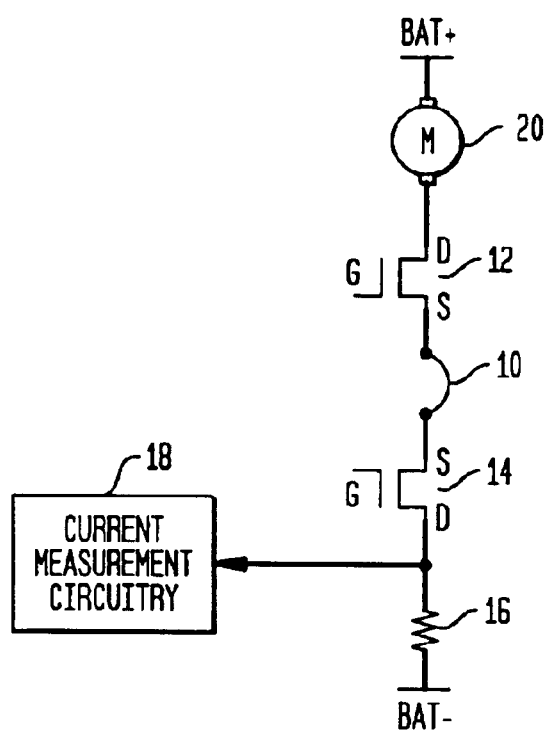
FIG. 1 a circuit showing a conventional application of a current shunt and a separate jump bar.
Figure 2:
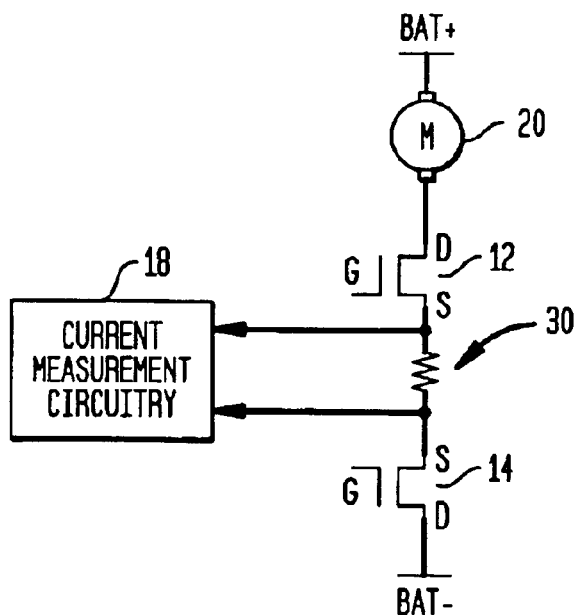
FIG. 2 is circuit showing the jump bar shunt structure in a motor circuit, provided in accordance with the principles of the present invention.
Figure 3:
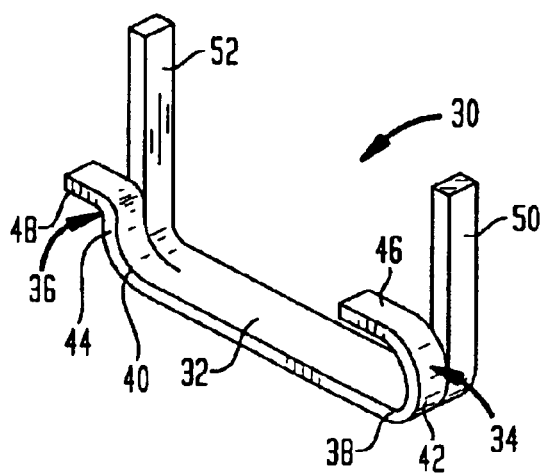
FIG. 3 is an enlarged perspective view of the jump bar shunt structure of the invention.
Figure 4:
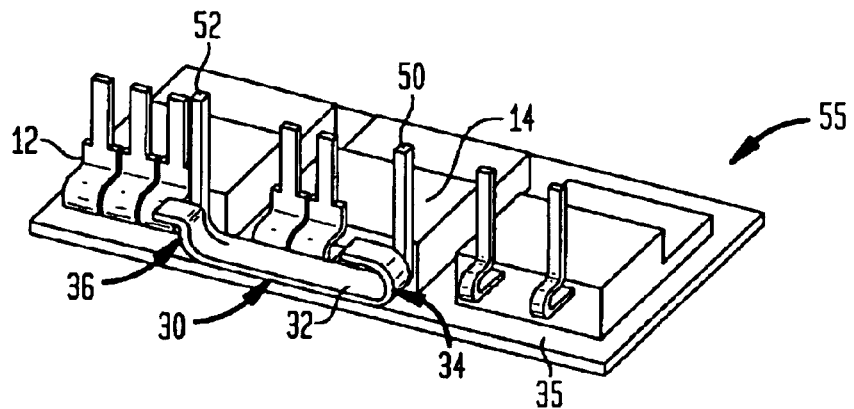
FIG. 4 is a perspective view of a power device assembly including the jump bar shunt structure of FIG. 3, shown mounted to a substrate and being coupled with power devices.

With reference to FIGS. 2–4, a jump bar shunt structure, provided in accordance with the invention is shown generally indicated at 30.

The jump bar structure 30 is employed in a power module assembly for powering a motor 20. The jump bar shunt structure includes a base 32 constructed and arranged to be mounted to a substrate 35 (FIG. 4). A pair of first legs, generally indicated at 34 and 36, are integral with the base 32 and are constructed and arranged to be connected between source legs of a pair of power devices such as MOSFETs 12 and 14. In the embodiment, the MOSFET 12 is a switching MOSFET that is turned ON and OFF at a constant frequency but variable duty cycle. The higher the duty cycle the greater the speed of the motor 20. The MOSFET 14 is a RVP MOSFET that conducts the motor current when the battery voltage has a normal polarity. The MOSFET 14 presents a very large resistance (mega ohms) when the battery voltage is reversed, therefore opening the motor current path.

The base 32 is elongated and has opposing ends 38 and 40. One leg 34 of the first pair of legs has a first portion 42 that extends upwardly from end 38 of the base and the other leg 36 of the first pair of legs has a first portion 44 that extends upwardly from the other end 40 of the base 32. As best shown in FIG. 3, each of the legs 34 and 36 of the first pair of legs has a second portion 46 and 48, respectively, extending transversely with regard to a respective first portion 42 and 44.

The jump bar shunt structure 30 includes a pair of second legs 50 and 52 integral with the base 32 and constructed and arranged to be connected to a printed circuit board (not shown). Leg 50 of the second pair of legs extends upwardly from the base at end 38 and the other leg 52 of the second pair of legs extends upwardly from the other end 40 of the base 32. Thus, each leg 50 and 52 of the second pair of legs is adjacent to the first portion 42 and 44, respectively, of a leg of the first pair of legs. In the embodiment, the jump bar shunt 30 is formed from a single piece of electrically conductive material with the base 32 acting as a current shunt.

With reference to FIG. 4, to define a power device assembly 55, the jump bar shunt structure 30 is soldered or glued to a substrate 35 along with power components (e.g., MOSFETs 12 and 14) to ensure good heat transfer. The substrate 35 is an electrically isolated heat conductive media. Leg 36 is coupled to the source leg of a switching MOSEFT 12, and leg 34 is coupled to a source leg of a reverse voltage protection (RVP) MOSFET 14. Thus, the jump bar shunt structure 30 carries the same high current as the motor 20, MOSFETs 12 and 14. The vertically extending legs 50 and 52 of the, jump bar shunt are connected to a PCB (not shown) to define a current sensing connection. It can be appreciated that the configuration of the legs 50 and 52 can be modified to optimize connection to the PCB. The size/dimension of the base 32 is calculated according to the desired resistance.

Figure 5:
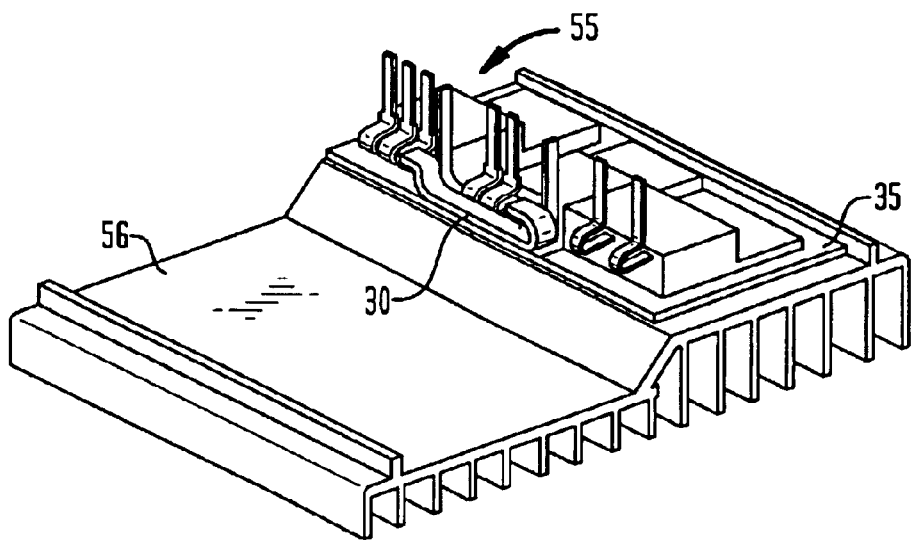
FIG. 5 is a perspective view of the power device assembly of FIG. 4, shown mounted on a heat sink.

With reference to FIG. 5, the substrate 35 of the power device assembly 55 is mounted on a heat sink 56 so as to dissipate heat.

Thus, the jump bar shunt structure 30 is a single component that carries high current between at least two power devices such as MOSFETs and converts current into voltage that is used by the current measurement circuitry 18. The advantage of the jump bar shunt structure 30 is that no high current (motor current) is flowing through the control PCB. Therefore, no heat is added to the control PCB. Mounting the jump bar shunt structure 30 on the substrate 35, attached on the heat sink 56 solves the thermal management of the jump bar shunt structure 30.

Although the jump bar shunt structure 30 has been described with regard to MOSFETS, the jump bar shunt structure 30 can be used for other applications where a current shunt is connected among two or more power devices. For example: two diodes are connected in parallel; the two common anodes are connected through a jump bar shunt structure 30 to a third power device, e.g., the collector of a power bipolar transistor.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claim.

What is claimed is:

1. A jump bar shunt structure comprising:
    a base constructed and arranged to be mounted to a substrate and to function as a current shunt,
    a pair of first legs integral with the base and being constructed and arranged to be connected between terminals of at least two power devices, and
    a pair of second legs integral with the base and being constructed and arranged to be connected to a printed circuit board so as to define a current sensing connection.

2. The jump bar shunt structure of claim 1, wherein each of the at least two power devices is a MOSFET.

3. The jump bar shunt structure of claim 1, wherein the base is elongated and has opposing ends, one leg of the first pair of legs having a first portion that extends upwardly from one of the ends of the base and the other leg of the first pair of legs having a first portion that extends upwardly from the other end of the base.

4. The jump bar shunt structure of claim 3, wherein each of said legs of said first pair of legs has a second portion extending transversely with respect to an associated said first portion.

5. The jump bar shunt structure of claim 4, wherein one leg of the second pair of legs extends upwardly from the base at one end of the base and the other leg of the second pair of legs extends upwardly from the other end of the base.

6. The jump bar shunt structure of claim 5, wherein each leg of said second pair of legs is adjacent to the first portion of a leg of said first pair of legs.

7. A power device assembly comprising:
    a substrate,
    a switching MOSEFT mounted to the substrate, the switching MOSFET having a source leg,
    a reverse voltage protection (RVP) MOSFET mounted to the substrate, the RVP MOSFET having a source leg, and
    a jump bar shunt structure including:
        a base,
        a pair of first legs integral with the base, one leg of the pair of first legs being connected to the source leg of the switching MOSFET and the other leg of the first pair of legs being connected to the source leg of the RVP MOSFET, and
        a pair of second legs integral with the base and being constructed and arranged to be connected to a printed circuit board so as to define a current sensing connection.

8. The assembly of claim 7, in combination with current measurement circuitry constructed and arranged to receive voltage converted from current by a shunt created by the base of the jump bar shunt structure.

9. The assembly of claim 7, in combination with a heat sink, the substrate being mounted on the heat sink so as to dissipate heat.

10. The assembly of claim 7, wherein the base of the jump bar shunt is elongated and has opposing ends, one leg of the first pair of legs having a first portion that extends upwardly from one of the ends of the base and the other leg of the first pair of legs having a first portion that extends upwardly from the other end of the base.

11. The assembly of claim 10, wherein each of said legs of said first pair of legs has a second portion extending transversely with respect to and associated said first portion.

12. The assembly of claim 11, wherein one leg of the second pair of legs extends upwardly from the base at one end of the opposing ends and the other leg of the second pair of legs extends upwardly from the other opposing end of the base.

13. The assembly of claim 12, wherein each leg of said second pair of legs is adjacent to the first portion of a leg of said first pair of legs.

14. A jump bar shunt structure comprising:
    a base constructed and arranged to be mounted to a substrate and to function as a current shunt,
    means, integral with the base, for interconnecting terminals of at least a pair of power devices, and
    means, integral with the base, for connecting to a printed circuit board so as to define a current sensing connection.

15. The jump bar shunt structure of claim 14, wherein the means for interconnecting source legs is a pair of first legs extending from the base and the means for connecting to a printed circuit board is a pair of second legs extending from the base.

16. The jump bar shunt structure of claim 14, wherein each of the pair of power devices is a MOSFET.

* * * * *